(12) United States Patent
Jeong

(10) Patent No.: US 9,768,235 B2
(45) Date of Patent: Sep. 19, 2017

(54) ORGANIC LIGHT EMITTING DISPLAY DEVICE

(71) Applicant: Samsung Display Co., Ltd., Yongin-si, Gyeonggi-do (KR)

(72) Inventor: Hee-Seong Jeong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/488,155

(22) Filed: Sep. 16, 2014

(65) Prior Publication Data

US 2015/0236075 A1    Aug. 20, 2015

(30) Foreign Application Priority Data

Feb. 19, 2014    (KR) .................. 10-2014-0018930

(51) Int. Cl.
*H01L 27/32* (2006.01)
*H01L 51/50* (2006.01)
*H01L 51/00* (2006.01)

(52) U.S. Cl.
CPC ........ *H01L 27/3211* (2013.01); *H01L 51/508* (2013.01); *H01L 51/5076* (2013.01); *H01L 51/0077* (2013.01); *H01L 51/0081* (2013.01)

(58) Field of Classification Search
CPC ............. H01L 2924/00; H01L 27/3209; H01L 27/3206; H01L 27/3211; H01L 27/3244; H01L 51/0081; H01L 51/508; H01L 51/0077; H01L 51/5016; H01L 51/525; H01L 51/5271; H01L 51/5203; H01L 51/5234; H01L 51/5281; H01L 51/56
(Continued)

(56) References Cited

U.S. PATENT DOCUMENTS

2002/0101154 A1* 8/2002 Seo ..................... H01L 27/3211
                                                             313/506
2003/0168972 A1    9/2003 Hamada et al.
(Continued)

FOREIGN PATENT DOCUMENTS

KR    10-2003-0074225 A    9/2003
KR    10-2005-0051061 A    6/2005
(Continued)

*Primary Examiner* — Julio J Maldonado
*Assistant Examiner* — Rodolfo D Fortich
(74) *Attorney, Agent, or Firm* — Knobbe Martens Olson & Bear LLP

(57) ABSTRACT

An organic light emitting display device includes a substrate, a first pixel configured emit light having a first color, and a second pixel configured to emit light having a second color different from the first color. Each of the first and second pixels comprises a first electrode formed over the substrate, a light emission layer formed over the first electrode, an electron transport layer formed over the light emission layer, and a second electrode formed over the electron transport layer. The electron transport layer comprises a first electron transport material and a second electron transport material different from the first electron transport material. A ratio by weight of the first electron transport material to the second electron transport material in the first pixel is substantially different from that of the first electron transport material to the second electron transport material in the second pixel.

17 Claims, 6 Drawing Sheets

(58) Field of Classification Search
USPC .................................. 257/192, 40, 59, 89, 72
See application file for complete search history.

(56) References Cited

U.S. PATENT DOCUMENTS

| | | |
|---|---|---|
| 2005/0112402 A1 | 5/2005 | Lee et al. |
| 2007/0001586 A1 | 1/2007 | Ryu et al. |
| 2012/0243219 A1* | 9/2012 | Ohsawa et al. ............... 362/230 |

FOREIGN PATENT DOCUMENTS

| | | |
|---|---|---|
| KR | 10-2006-0097925 A | 9/2006 |
| KR | 10-2010-0076789 A | 7/2010 |

* cited by examiner

| 600 | | |
|---|---|---|
| 610 | | |
| 500 | | |
| 501 | | 430 |
| | 420 | |
| 410 | 320 | 330 |
| 300 | | |
| 210 | 220 | 230 |
| 100 | | |

FIG. 4

| 600 |
|---|
| 610 |
| 500 |

| | 502 | 430 |
|---|---|---|
| | 420 | |
| 410 | 320 | 330 |

| 300 |
|---|

| 210 | 220 | 230 |
|---|---|---|

| 100 |
|---|

FIG. 5

| 600 |
|---|
| 610 |
| 500 |

| | | 503 |
|---|---|---|
| | | 430 |
| | 420 | |
| 410 | 320 | 330 |

| 300 |
|---|

| 210 | 220 | 230 |
|---|---|---|

| 100 |
|---|

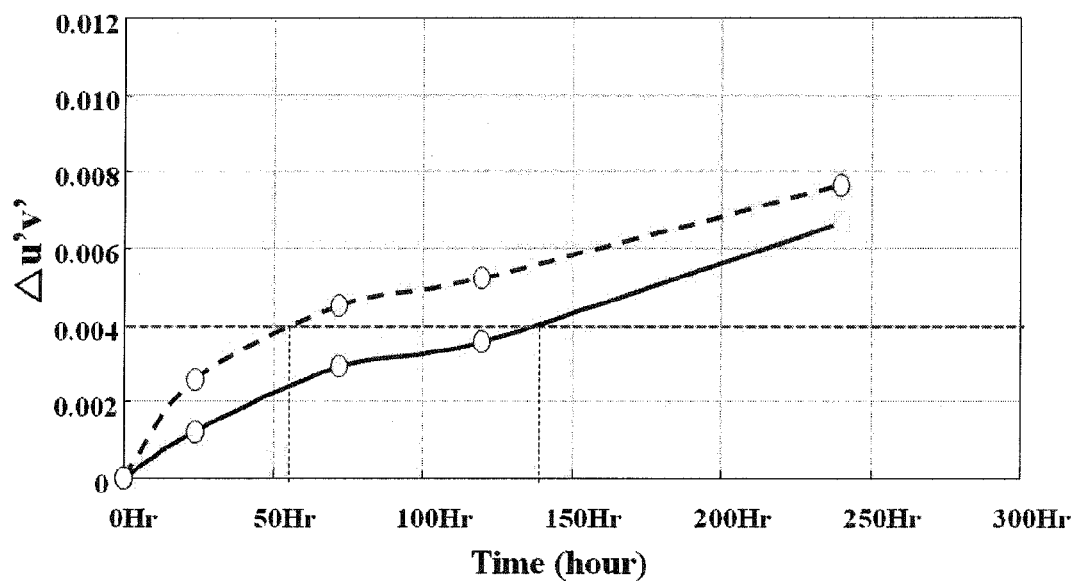

ORGANIC LIGHT EMITTING DISPLAY DEVICE

CROSS-REFERENCE TO PATENT APPLICATION

This application claims priority to and the benefit of Korean Patent Application No. 10-2014-0018930, filed on Feb. 19, 2014, with the Korean Intellectual Property Office, the disclosure of which is incorporated herein in its entirety by reference.

BACKGROUND

1. Field

The present disclosure relates to an organic light emitting display device including a plurality of pixels which emit different colors.

2. Description of the Related Art

An organic light emitting display device is a self-emissive display device that includes organic light emitting diodes so as to display images. The organic light emitting display device is thin and lightweight, and also has advantages of low power consumption, high brightness, and short response time.

An organic light emitting display device includes a plurality of organic light emitting diodes, which emit different colors of light, for color display. For example, the organic light emitting display device includes blue, green, and red organic light emitting diodes, thereby controlling light intensity emitted from the organic light emitting diodes so that a desired color is displayed.

An organic light emitting diode includes a hole injection electrode, a light emission layer, and an electron injection electrode. Herein, holes injected from the hole injection electrode and electrons injected from the electron injection electrode are combined with each other in the light emission layer to form excitons, and light is emitted by energy that is generated when the excitons fall to the ground state.

An organic light emitting diode deteriorates with use thereof. The deterioration rate of blue, green, and red organic light emitting diodes included in an organic light emitting display device is not always identical to each other, and if any one of the organic light emitting diodes deteriorates, whole color properties of the display device are attenuated. Therefore, various researches are being carried out to improve lifespan characteristics of the organic light emitting diodes.

SUMMARY

Aspects of embodiments of the present invention are directed to an organic light emitting display device with enhanced lifespan characteristics by improving a composition of an electron transport layer included in an organic light emitting diode.

Further, aspects of embodiments of the present invention are directed to an organic light emitting display device with enhanced lifespan characteristics by separately adjusting a composition or thickness of an electron transport layer for each organic light emitting diode.

One aspect of the invention provides an organic light emitting display device, which may comprise: a substrate; a first pixel disposed over the substrate and configured emit light having a first color; and a second pixel disposed over the substrate and configured to emit light having a second color different from the first color; wherein each of the first and second pixels comprises a first electrode formed over the substrate, a light emission layer formed over the first electrode, an electron transport layer formed over the light emission layer, and a second electrode formed over the electron transport layer, and wherein the electron transport layer comprises a first electron transport material and a second electron transport material different from the first electron transport material, wherein a ratio by weight of the first electron transport material to the second electron transport material in the first pixel is substantially different from that of the first electron transport material to the second electron transport material in the second pixel.

In the foregoing device, each of the first and second electron transport materials may comprise one selected from the group consisting of tris(8-quinolinolate) aluminum (Alq3), TAZ, Balq, 8-hydroxyquinolatolithium (Liq), bis(10-hydroxybenzo[h]quinolinatoberyllium) (Bebq2), and derivatives thereof. The first electron transport material may be Alq3 and the second electron transport material may be Liq. The device may further comprise a third pixel disposed over the substrate and configured to emit light having a third color different from the first and second colors, wherein the first, second and third colors are blue, green, and red, respectively. The ratio by weight of Alq3 to Liq in the first pixel may be about 2:8 to about 5:5. The ratio by weight of Alq3 to Liq in the second pixel may be about 3:7 to about 6:4. The ratio by weight of Alq3 to Liq in the third pixel may be about 4:6 to about 7:3.

Still in the foregoing device the electron transport layer of the first pixel may have a first thickness measured along a direction perpendicular to a major surface of the substrate, wherein the electron transport layer of the second pixel may have a second thickness measured along the direction and substantially smaller than the first thickness. The electron transport layer of the first pixel may comprise first and second sub-layers, wherein a ratio by weight of the first electron transport material to the second electron transport material in the first sub-layer is substantially different from that of the first electron transport material to the second electron transport material in the second sub-layer. The electron transport layer of the second pixel and the first sub-layer of the first pixel may be integrated in a single common layer such that the ratio by weight of the first electron transport material to the second electron transport material in the first sub-layer of the first pixel is substantially the same as that of the first electron transport material to the second electron transport material in the electron transport layer of the second pixel.

Another aspect of the invention provides an organic light emitting display device, which may comprise: a substrate; a first pixel disposed over the substrate and configured emit light having a first color; and a second pixel disposed over the substrate and configured to emit light having a second color different from the first and second colors; and a third pixel disposed over the substrate and configured to emit light having a third color different from the first and second colors; wherein each of the first, second and third pixels comprises first and second electrodes formed over the substrate and a light emission layer disposed between the first and second electrodes, wherein the first, second and third pixels in combination comprise a common electron transport layer disposed between the light emission layer and the second electrode of each of the first, second and third pixels, wherein the first pixel comprises an auxiliary electron transport layer disposed between the light emission layer and the second electrode, wherein each of the common electron transport layer and auxiliary electron transport layer comprises a first electron transport material and a second electron transport material different from the first electron transport material, wherein a ratio by weight of the first electron transport material to the second electron transport material in the common electron transport layer is substantially different from that of the first electron transport material to the second electron transport material in the auxiliary electron transport layer.

In the foregoing device, the common electron transport layer may comprise the first electron transport material of Alq3 and the second electron transport material of Liq, and a ratio by weight of Alq3 to Liq is about 4:6 to about 7:3. The common electron transport layer may have a thickness of about 200 Å to about 450 Å. The auxiliary electron transport layer may comprise the first electron transport material of Alq3 and the second electron transport material of Liq. The first, second and third colors may be blue, green, and red, respectively.

Still in the foregoing device, the first, second and third colors may be blue, green, and red, respectively, wherein the auxiliary electron transport layer of the first pixel comprises the first electron transport material of Alq3 and the second electron transport material of Liq, and a ratio by weight of Alq3 to Liq is about 2:8 to about 5:5. The first, second and third colors may be green, blue, and red, respectively, wherein the auxiliary electron transport layer of the first pixel comprises the first electron transport material of Alq3 and the second electron transport material of Liq, and a ratio by weight of Alq3 to Liq is about 3:7 to about 6:4. The auxiliary electron transport layer may have a thickness of about 50 Å to about 100 Å. The common electron transport layer may contact the auxiliary electron transport layer. The second pixel may comprise another auxiliary electron transport layer, wherein the other auxiliary electron transport layer comprises the first electron transport material and the second electron transport material different from the first electron transport material, wherein a ratio by weight of the first electron transport material to the second electron transport material in the other auxiliary electron transport layer is substantially different from that of the first electron transport material to the second electron transport material in each of the common electron transport layer and auxiliary electron transport layer.

According to an embodiment of the present invention, an organic light emitting display device includes a substrate and at least three pixels on the substrate, emitting different colors of light, wherein the pixel includes a first electrode on the substrate, a light emission layer on the first electrode, an electron transport layer on the light emission layer, and a second electrode on the electron transport layer, and wherein the electron transport layer includes at least two electron transport materials, and the electron transport materials have different ratios by weight in at least one of the pixels.

The electron transport material is selected from the group consisting of tris(8-quinolinolate) aluminum (Alq3), TAZ, Balq, 8-hydroxyquinolatolithium (Liq), bis(10-hydroxybenzo[h]quinolinatoberyllium) (Bebq2), and derivatives thereof.

The electron transport material is made of Alq3 and Liq.

The three pixels include blue, green, and red pixels.

The blue pixel includes the electron transport layer in which a ratio by weight of Alq3 to Liq is 2:8-5:5.

The green pixel includes the electron transport layer in which a ratio by weight of Alq3 to Liq is 3:7-6:4.

The red pixel includes the electron transport layer in which a ratio by weight of Alq3 to Liq is 4:6-7:3.

The electron transport layer includes a common electron transport layer that is included in the three pixels in common, and an auxiliary electron transport layer that is included in at least one of the three pixels.

The common electron transport layer includes the electron transport material in which a ratio by weight of Alq3 to Liq is 4:6-7:3.

The common electron transport layer has a thickness of about 200 Å to about 450 Å.

The auxiliary electron transport layer includes Alq3 and Liq.

The three pixels include blue, green, and red pixels.

The blue pixel includes the auxiliary electron transport layer, and the auxiliary electron transport layer includes the electron transport material in which a ratio by weight of Alq3 to Liq is 2:8-5:5.

The green pixel includes the auxiliary electron transport layer, and the auxiliary electron transport layer includes the electron transport material in which a ratio by weight of Alq3 to Liq is 3:7-6:4.

The auxiliary electron transport layer has a thickness of about 50 Å to about 100 Å.

According to embodiments of the present invention, an organic light emitting display device has improved lifespan characteristics by adjusting a composition of an electron transport layer in an organic light emitting diode. Further, according to embodiments of the present invention, an organic light emitting display device has an improved color lifespan by adjusting a composition or thickness of an electron transport layer in an organic light emitting diode for each pixel.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present invention will be more clearly understood from the following detailed description taken in conjunction with the accompanying drawings, in which:

FIG. 4 is a schematic view of a configuration of an organic light emitting display device according to a fourth embodiment of the present invention;

FIG. 5 is a schematic view of a configuration of an organic light emitting display device according to a fifth embodiment of the present invention;

FIG. 6 is a schematic view of a configuration of an organic light emitting display device according to a sixth embodiment of the present invention;

FIG. 7 is a graph of measurement of a color lifespan of the organic light emitting display device according to the third embodiment of the present invention.

DETAILED DESCRIPTION

Figure 1:
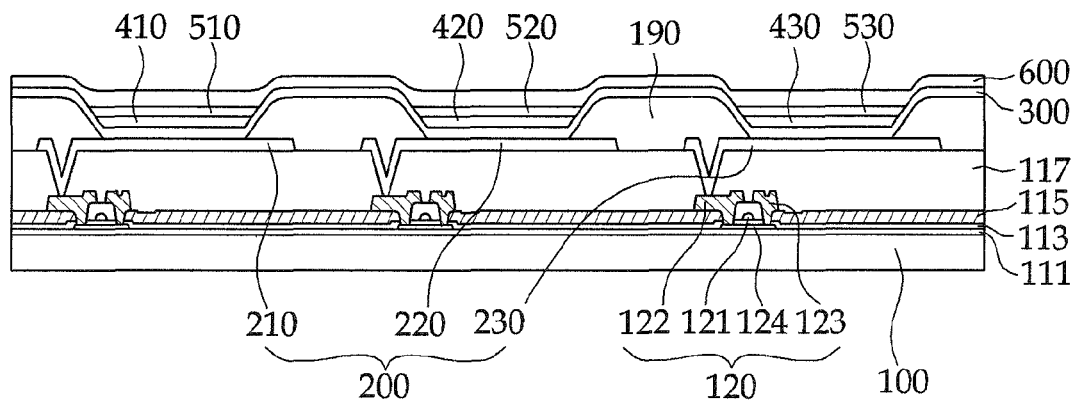
FIG. 1 is a cross-sectional view illustrating an organic light emitting display device according to a first embodiment of the present invention.

Hereinafter, embodiments of the present invention are described in more detail below with reference to the accompanying drawings. However, the scope of the present invention is not limited to the following description or embodiments shown in the drawings. The accompanying drawings are only for illustration of embodiments selected from among the various embodiments of the present invention, and thus, should not limit the scope of the present invention.

In the drawings, certain elements or shapes may be simplified or exaggerated to better illustrate embodiments of the invention, and other elements present in an actual product may also be omitted. Thus, the drawings are intended to facilitate the understanding of the invention.

Throughout the disclosure, like reference numerals refer to like elements throughout the various figures and embodiments of the present invention. In addition, when a layer or element is referred to as being "on" another layer or element, the layer or element may be directly on the other layer or element, or one or more intervening layers or elements may be interposed therebetween.

FIG. 1 is a cross-sectional view illustrating an organic light emitting display device according to a first embodiment of the present invention.

The organic light emitting display device includes a substrate 100 and a plurality of gate lines, a plurality of data lines, and a power line (not shown) on the substrate 100. The gate line and the data line intersect each other so as to define a pixel area. The pixel area may be defined by a black matrix or a pixel defining layer (PDL) 190. Herein, a pixel is the smallest unit for displaying an image, and the organic light emitting display device displays an image through a plurality of pixels.

The pixel of the organic light emitting display device includes a first electrode 200 on the substrate 100, a hole layer 300 on the first electrode 200, light emission layers 410, 420, and 430 on the hole layer 300, electron transport layers 510, 520, and 530 on the light emission layers 410, 420, and 430, a second electrode 600 on the electron transport layers 510, 520, and 530.

The substrate 100 may be made of an insulating material such as glass, quartz, ceramic, plastic, or the like. For instance, the substrate 100 may be made of glass or transparent plastic, which has excellent mechanical strength, thermal stability, transparency, surface uniformity, tractability, and waterproofing characteristics.

The pixel may further include a switching thin film transistor (TFT), a driving TFT, and a capacitor. The switching TFT receives a scan signal from the gate line and a data signal from the data line, and transmits the scan and data signals to the capacitor.

The capacitor stores charges corresponding to data voltage transmitted from the switching TFT. The driving TFT 120 is switched by the charges stored in the capacitor and allows driving power to be connected to the first electrode 200, thereby driving the light emission layers 410, 420, and 430.

Referring to FIG. 1, among a plurality of TFTs of the pixel, the driving TFT 120 includes a gate electrode 121, a drain electrode 122, a source electrode 123, and a semiconductor layer 124 on the substrate 100. The driving TFT 120 only is illustrated in FIG. 1, but other TFTs may have the same structure as the driving TFT 120.

The driving TFT 120 may further include a gate insulating layer 113 and an interlayer insulating layer 115. The structure of the driving TFT 120 is not limited to that of FIG. 1, and the driving TFT 120 may have different structures. A buffer layer 111 made of silicon oxide, silicon nitride, or the like may be further disposed between the driving TFT 120 and the substrate 100. The buffer layer 111 may be made of an organic layer.

A planarization layer 117 is disposed on the driving TFT 120 to be configured for insulation and protection of a driving element such as the driving TFT 120. The planarization layer 117 may be made of an inorganic or organic layer.

The first electrode 200, the light emission layer 410, 420, and 430, and the second electrode 600 are disposed on the planarization layer 117. The planarization layer 117 has a contact hole, and the first electrode 200 is connected to the driving TFT 120 through the contact hole. The first electrode 200 connected to the driving TFT 120 is a pixel electrode serving as an anode.

The first electrode 200 may be a transparent or reflective electrode.

The transparent electrode may be any one selected from the group consisting of Indium Tin Oxide (ITO), Indium Zinc Oxide (IZO), zinc oxide (ZnO), and indium oxide ($In_2O_3$). The reflective electrode may have a multilayer structure that includes a reflective layer including at least one selected from the group consisting of silver (Ag), magnesium (Mg), aluminum (Al), platinum (Pt), palladium (Pd), gold (Au), nickel (Ni), neodymium (Nd), iridium (Ir), and chromium (Cr), and a transparent conducting layer including at least one selected from the group consisting of Indium Tin Oxide (ITO), Indium Zinc Oxide (IZO), zinc oxide (ZnO), and indium oxide ($In_2O_3$), on the reflective layer. The first electrode 200 may also have a triple-layered structure including a transparent conducting layer, a metal layer, and a transparent conducting layer. An example of the first electrode 200 includes a triple-layered structure of ITO—Ag—ITO. The organic light emitting display device of FIG. 1 is classified as a top emission device, and the first electrode 200 may be the reflective electrode.

A pixel defining layer (PDL) 190 is disposed between the first electrodes 210, 220, and 230. The PDL 190 is made of an insulating material and defines a pixel area on the first electrode 200. The PDL 190 may cover an end portion of the first electrode 200.

A hole layer 300 is disposed on the first electrode 200. The hole layer 300 may include at least one of a hole injection layer and a hole transport layer, or may include a hole injection and transport layer that can inject and transport holes. In an embodiment, the hole layer 300 is provided, while in another embodiment, the hole layer is not provided.

The hole injection layer may be formed using vacuum deposition, spin coating, or the like. For example, the hole injection layer includes at least one selected from the group consisting of phthalocyanine compounds such as copper phthalocyanine (CuPc), TCTA, m-MTDATA, m-MTDAPB, Pani/DBSA [Polyaniline/Dodecylbenzenesulfonic acid], PEDOT/PSS [Poly(3,4-ethylenedioxythiophene)/Poly(4-styrenesulfonate)], Pani/CSA [Polyaniline/Camphor sulfonic acid], and PANI/PSS [Polyaniline/Poly (4-styrene-sulfonate)]. However, embodiments of the present invention are not limited thereto.

The hole transport layer may be disposed on the hole injection layer, or only the hole transport layer may be disposed on the first electrode 200. The hole transport layer may be formed using vacuum deposition, spin coating, casting, or the like, and the vacuum deposition in particular may be applied for the reason that uniform layers can be easily obtained and defects like pinholes occur less frequently.

A hole transport material includes, for example, N,N'-bis(3-methylphenyl)-N,N'-diphenyl-[1,1-biphenyl]-4,4'-diamine (TPD), N,N'-di(naphthalene-1-yl)-N,N'-diphenyl-benzidine (α-NPD), or the like.

The hole injection and transport layer, which enables both injection and transport of holes, may be disposed on the first electrode 200. The hole injection and transport layer may be made of doped hole injection and transport materials, and may be formed by continuous deposition or co-deposition using the hole injection and transport materials.

The hole layer 300 is formed to be a common layer. Therefore, the hole layer 300 may be formed by, for example, vacuum deposition without using a mask.

The light emission layers 410, 420, and 430 are disposed on the hole layer 300. The light emission layers 410, 420, and 430 are disposed in pixel areas on the first electrode 200. The light emission layers 410, 420, and 430 may include a blue emission layer 410, a green emission layer 420, and a red emission layer 430. Although not illustrated, a white emission layer may be included.

In embodiments, the blue emission layer 410 includes at least one selected from the group consisting of oxadiazole dimer dyes (Bis-DAPOXP), Spiro compounds (Spiro-DPVBi, Spiro-6P), triarylamine compounds, bis(styryl)amine, DPVBi, DSA, 4,4'-bis(9-ethyl-3-carbazovinylene)-1,1'-biphenyl (BCzVBi), perylene, 2,5,8,11-tetra(tert-butyl) perylene (TBPe), 9H-carbazole-3,3'-(1,4-phenylene-di-2,1-ethene-diyl)bis[9-ethyl-(9C)] (BCzVB), 4,4-bis[4-(di-p-tolylamino)styryl]biphenyl (DPAVBi), 4-(di-p-tolylamino)-4'-[(di-p-tolylamino)styryl]stylbene (DPAVB), 4,4'-bis[4-(diphenylamino)styryl]biphenyl (BDAVBi), and bis(3,5-difluoro-2-(2-pyridyl)phenyl-(2-carboxypyridyl)iridium III (FIrPic).

In embodiments, the green emission layer 420 include, for example, at least one selected from the group consisting of 3-(2-benzothiazolyl)-7-(diethylamino)coumarin (Coumarin 6), 2,3,6,7-tetrahydro-1,1,7,7-tetramethyl-1H,5H,11H-10-(2-benzothiazolyl)quinolizino-[9,9a,1gh]coumarin (C545T), N,N'-dimethyl-quinacridone (DMQA), and tris(2-phenylpyridine)iridium (III) (Ir(ppy)3).

In embodiments, the red emission layer 430 include, for example, at least one selected from the group consisting of tetraphenyl-naphthacene, rubrene, tris(1-phenylisoquinoline) iridium (III) (Ir(piq)3), bis(2-benzo[b]thiophen-2-yl-pyridine)(acetylacetonate)iridium(III) (Ir(btp)2(acac)), tris(dibenzoylmethane)phenanthroline europium(III) (Eu(dbm)3(phen)), tris[4,4'-di-tert-butyl-(2,2)-bipyridine]ruthenium (III) complex (Ru(dtb-bpy)3*2(PF6)), DCM1, DCM2, Eu(thenoyltrifluoroacetone)3 (Eu(TTA)3), and butyl-6-(1,1,7,7-tetramethyljulolidyl-9-enyl)-4H-pyran (DCJTB).

The light emission layers 410, 420, and 430 may further include not only an emissive host but also an emissive dopant. Examples of a fluorescent host material include tris(8-hydroxy-quinolinato) aluminum (Alq3), 9,10-di(naphth-2-yl)anthracene (ADN), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di(tert-butyl)phenyl (p-TDPVBi), and/or the like.

Examples of a phosphorescent host material include 1,3-bis(carbazol-9-yl)benzene (mCP), 1,3,5-tris(carbazol-9-yl)benzene (tCP), 4,4',4''-tris(carbazol-9-yl)triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), and/or the like.

The blue, green, and red emissive materials may be used as the emissive dopant.

An emission layer may be formed by a method such as vacuum deposition, spin coating, casting, Langmuir-Blodgett (LB), or the like.

In the present disclosure, a pixel including the blue emission layer 410 is called a blue pixel, a pixel including the green emission layer 420 is called a green pixel, and a pixel including the red emission layer 430 is called a red pixel.

The electron transport layers 510, 520, and 530 are disposed on the light emission layers 410, 420, and 430. The electron transport layers 510, 520, and 530 may be made of an electron transport material that can transport electrons injected from an electron injection electrode. Examples of the electron transport material include quinoline derivatives, and particularly tris(8-quinolinolate) aluminum (Alq3), TAZ, Balq, and 8-hydroxy quinolatolithium (Liq). In addition, bis(10-hydroxybenzo[h]quinolinatoberyllium) (Bebq2) or derivatives thereof may be used as the electron transport material. A metal oxide may be used in conjunction with the electron transport material. Examples of the metal oxide include an alkali metal oxide, an alkaline earth metal oxide, and a transition metal oxide.

In embodiments, (8-quinolinolate) aluminum (hereinafter referred to as "Alq3") and 8-hydroxyquinolatolithium (hereinafter referred to as "Liq") are used together as the electron transport material.

When Liq reacts with aluminum of Alq3, a molecular orbital of Alq3 has high bond energy so that a new band gap is created and an electron injection barrier is lowered, thereby improving electron transfer efficiency.

The electron transport layer is known as relating to a lifespan of an organic light emitting diode (OLED). For instance, if electron transport efficiency is enhanced by the electron transport layer, driving voltage of a pixel may be lowered so that pixel deterioration may be delayed and an OLED lifespan may be extended. Further, if the electron transport layer is made of a mixture of two or more substances or materials, the OLED lifespan may vary depending on a ratio by weight of two or more substances or materials.

Meanwhile, the OLED lifespan includes a luminance lifespan and a color lifespan. The luminance lifespan refers to the time when luminance is maintained above reference luminance, and the color lifespan refers to the time when a degree of color shift is maintained below a reference value.

The luminance lifespan is known as being improved when a thickness of the electron transport layer made of a mixture of Liq and Alq3 becomes larger, or a content ratio of Liq increases. However, the color lifespan is not improved simultaneously with the improvement of the luminance lifespan, and although the luminance lifespan of an OLED is enhanced, the color lifespan is not enhanced or is reduced. Even when an OLED has an improved luminance lifespan, it may be difficult to use the OLED because the color lifespan thereof may decrease. Therefore, it is important that the OLED color lifespan is also improved together with the luminance lifespan.

According to an embodiment of the present invention, a composition and thickness of the electron transport layer are adjusted to prevent the color lifespan of blue, green, and red pixels from decreasing while the luminance lifespan is improved. That is, a ratio by weight of Liq to Alq3 composing the electron transport layer of the OLED and a thickness of the electron transport layer may be adjusted for each pixel.

Consequently, mixture ratios of Alq3 to Liq composing the electron transport layers 510, 520, and 530 are not consistent with each other in each pixel of the organic light emitting display device according to the first embodiment of the present invention. Referring to FIG. 1, the organic light emitting display device includes at least three pixels such as blue, green, and red pixels, which emit different colors of light, and at least one of the three pixels includes an electron transport layer having an electron transport layer with a ratio by weight of the materials substantially different from that of another pixel.

In embodiments, the ratio by weight of the materials in an electron transport layer of a green pixel may be substantially different from that of a blue pixel so as to decrease a difference of color life spans of the green and blue pixels that would have been if there were no substantial difference in the ratios by weight of the materials in an electron transport layers of the green and blue pixels. Similarly, in embodiments, the ratio by weight of the materials in an electron transport layer of a green pixel may be substantially different from that of a red pixel so as to decrease a difference of color life spans of the green and red pixels that would have been if there were no substantial difference in the ratios by weight of the materials in an electron transport layers of the green and red pixels. Also, in embodiments, the ratio by weight of the materials in an electron transport layer of a blue pixel may be substantially different from that of a red pixel so as to decrease a difference of color life spans of the blue and red pixels that would have been if there were no substantial difference in the ratios by weight of the materials in an electron transport layers of the blue and red pixels.

In detail, a ratio by weight of Alq3 to Liq composing the electron transport layers 510, 520, and 530 may be from about 2:8 to about 7:3. The electron transport layer 510 of the blue pixel may have a ratio by weight of about 2:8 to about 5:5, the electron transport layer 520 of the green pixel may have a ratio by weight of about 3:7 to about 6:4, and the electron transport layer 530 of the red pixel may have a ratio by weight of about 4:6 to about 7:3.

Each of the electron transport layers 510, 520, and 530 has a thickness of about 150 Å to about 600 Å. Each of the electron transport layers 510, 520, and 530 may have a thickness of greater than about 150 Å to enhance electron transport capability. Each of the electron transport layers 510, 520, and 530 may have a thickness of smaller than about 600 Å to avoid increase of driving voltage of the OLED.

The electron transport layer may be formed by vacuum deposition, spin coating, casting, or the like. For instance, in the case where the electron transport layers 510, 520, and 530 are formed by the vacuum deposition, the deposition is performed using three masks in order to form the electron transport layers 510, 520, and 530 having different compositions or different mixtures of materials having different ratios. In this case, the electron transport layers 510, 520, and 530 of the pixel may be formed to have different thicknesses.

The second electrode 600 is disposed on the electron transport layers 510, 520, and 530. The second electrode 600 may be made of a metal, alloy, or electrically conductive compound, which has low work function, or a mixture thereof.

In detail, examples of the second electrode 600 include at least one selected from the group consisting of lithium (Li), magnesium (Mg), aluminum (Al), aluminum-lithium (Al—Li), calcium (Ca), magnesium-indium (Mg—In), magnesium-silver (Mg—Ag), and the like.

Further, in a top-emitting OLED display, the second electrode 600 may have a multilayer structure that includes a metal layer and a light transmitting material such as ITO, IZO, or the like on the metal layer. The second electrode 600 may be formed by vacuum deposition, sputtering, or the like.

The second electrode 600 is formed to be a common electrode, and for example it may be formed by vacuum deposition without using a mask.

Although not illustrated, a sealing material or an encapsulation layer may be further disposed on the second electrode 600, or a capping layer may be further disposed thereon.

Hereinafter, a second embodiment of the present invention will be provided with reference to FIGS. 2A and 2B. Repeated description of the same elements that have been described above with reference to FIG. 1 will not be provided below.

Figure 2A:
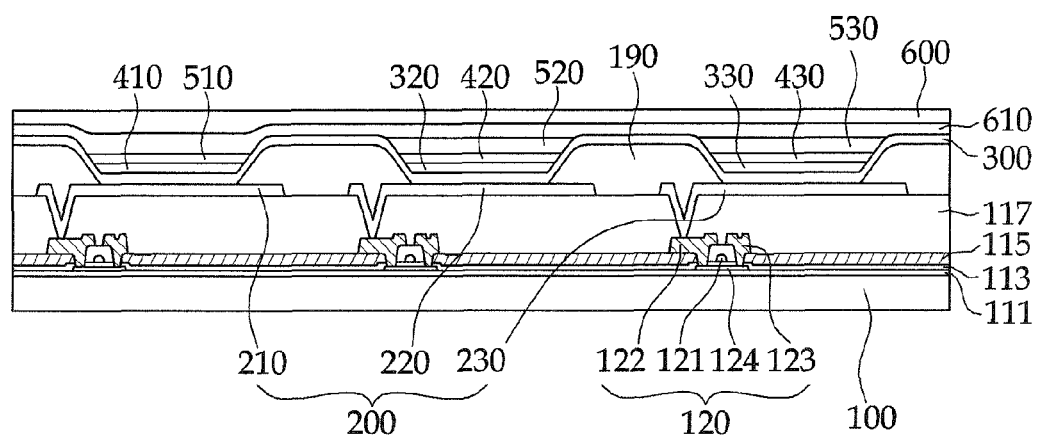
FIG. 2A is a cross-sectional view illustrating an organic light emitting display device according to a second embodiment of the present invention.

An organic light emitting display device of FIG. 2A includes hole injection layers 320 and 330 in green and red pixel areas on a hole layer 300 that is a common layer. The hole injection layers 320 and 330 are disposed on the hole layer 300 of the green and red pixels so as to serve to facilitate hole supply to green and red emission layers 420 and 430. The hole injection layers 320 and 330 may include the above-described hole injection material and a p-type dopant.

A thickness of the hole injection layers 320 and 330 may vary depending on the pixels in consideration of hole injection characteristics of the green and red pixels. For instance, the hole injection layer 330 in the red pixel may be thicker than the hole injection layer 320 in the green pixel.

An electron injection layer 610 is disposed on electron transport layers 510, 520, and 530. The electron injection layer 610 may include any one selected from the group consisting of LiF, NaCl, CsF, Li2O, BaO, and Liq. The electron injection layer 610 may have a thickness of about 5 Å to about 20 Å. In the case where the electron injection layer 610 has a thickness of less than about 5 Å, electron injection efficiency increases very slightly. In the case where the electron injection layer 610 has a thickness of more than about 20 Å, it may result in increasing driving voltage.

The electron injection layer 610 may be formed by vacuum deposition, spin coating, casting, or the like. Each condition for deposition vanes depending on used compounds, but it may be selected from deposition conditions that are nearly identical to one for forming a general hole injection layer. The electron injection layer 610 may be formed to be a common layer.

Figure 2B:
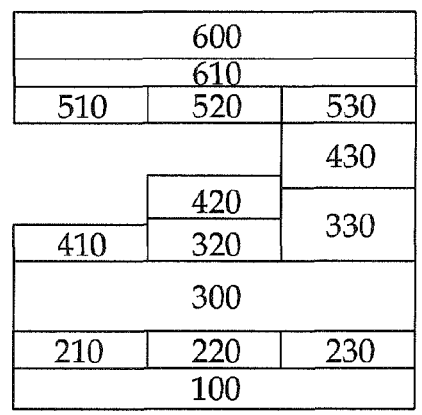
FIG. 2B is a schematic view of a configuration of the organic light emitting display device illustrated in FIG. 2A.

FIG. 2B is a schematic view of a configuration of the organic light emitting display device illustrated in FIG. 2A. Referring to FIG. 2B, pixel components and relative laminated sequence thereof are disclosed, and adjacent or separated components are not necessarily adjacent to or separated from each other physically.

Although not illustrated, a sealing material or an encapsulation layer may be further disposed on the second electrode 600, or a capping layer may be further disposed thereon.

Hereinafter, a third embodiment of the present invention will be provided with reference to FIGS. 3A and 3B.

Figures 3A, 3B:
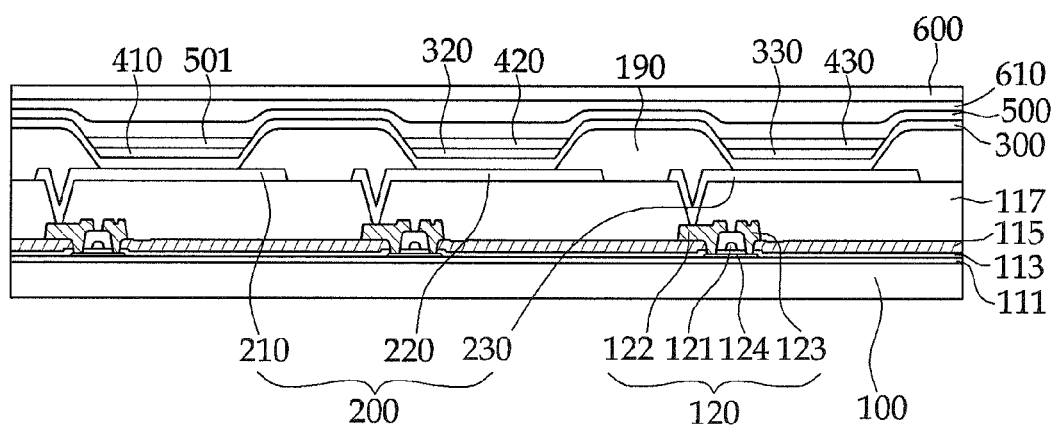
FIG. 3A is a cross-sectional view illustrating an organic light emitting display device according to a third embodiment of the present invention.
FIG. 3B is a schematic view of a configuration of the organic light emitting display device illustrated in FIG. 3A.

An organic light emitting display device of FIG. 3A includes hole injection layers 320 and 330 in green and red pixel areas on a hole layer 300 that is a common layer.

Referring to FIG. 3A, the organic light emitting display device includes a common electron transport layer 500 and an auxiliary electron transport layer 501 in a blue pixel area. That is, the blue pixel includes the common electron transport layer 500 and the auxiliary electron transport layer 501. Hereinafter, the auxiliary electron transport layer 501 in the blue pixel area will be defined as the "blue electron transport layer 501."

In this case, the blue pixel includes the blue electron transport layer 501 on the blue emission layer 410, and the common electron transport layer 500 on the blue electron transport layer 501.

In the illustrate embodiment, the green and red pixels include the common electron transport layer 500 and do not include additional auxiliary electron transport layer.

The common electron transport layer 500 is disposed in the blue, green, and red pixel areas, and serves to increase electron transport efficiency and lower driving voltage of an OLED. As a result, the common electron transport layer 500 can contribute to extension of an OLED lifespan.

The common electron transport layer 500 has a thickness and composition to increase a luminance lifespan of the OLED in particular. In the organic light emitting display device of FIG. 3A, the common electron transport layer 500 includes Alq3 and Liq and has a ratio by weight of Alq3 to Liq of about 4:6 to about 7:3, and the common electron transport layer 500 has a thickness of about 200 Å to about 450 Å. For instance, the common electron transport layer 500 may have a Alq3 to Liq ratio by weight of 5:5, and may have a thickness of 330 Å.

In this embodiment, the luminance lifespan of the OLED may be adjusted by the common electron transport layer 500, and in order to prevent a color lifespan from decreasing, the pixel for each color may further include the auxiliary electron transport layer.

For example, referring to FIG. 3A, the blue pixel further includes the blue electron transport layer 501 on the blue emission layer 410 for increasing the color lifespan.

The blue electron transport layer 501 may have a Alq3 to Liq ratio by weight of about 2:8 to about 5:5, and may have a thickness of about 50 Å to about 100 Å. In detail, the blue electron transport layer 501 may have a Alq3 to Liq ratio by weight of 4:6, and may have a thickness of 50 Å.

In the illustrated embodiment, a ratio by weight of Alq3 to Liq in the common electron transport layer is substantially different from that of Alq3 to Liq in the auxiliary electron transport layer. As the results, a ratio by weight of Alq3 to Liq in the combination of the common electron transport layer and the auxiliary electron transport layer of the blue pixel is substantially different from that of Alq3 to Liq in the common electron transport layer in each of the green and red pixels so as to decrease a difference of color life spans of the blue pixel and each of green and red pixels that would have been if there were no auxiliary electron transport layer in the blue pixel.

The blue electron transport layer 501 may be formed by co-deposition using a deposition source made of Alq3 and a deposition source made of Liq, or may be formed by deposition using a mixed deposition source having a Alq3 to Liq ratio by weight of about 4:6.

Hereinafter, a fourth embodiment of the present invention will be provided with reference to FIG. 4. An organic light emitting display device of FIG. 4 includes a common electron transport layer 500 and an auxiliary electron transport layer 502 on a green emission layer 420. In this case, the auxiliary electron transport layer 502 is disposed on the green emission layer 420 so as to prevent a color lifespan of the green pixel from decreasing due to the common electron transport layer 500 contributing to the luminance lifespan extension. The structure allows the organic light emitting display device to have improved lifespans of both luminance and color.

In the illustrated embodiment, a ratio by weight of Alq3 to Liq in the common electron transport layer 500 is substantially different from that of Alq3 to Liq in the auxiliary electron transport layer 502. As the results, a ratio by weight of Alq3 to Liq in the combination of the common electron transport layer 500 and the auxiliary electron transport layer 502 of the green pixel is substantially different from that of Alq3 to Liq in the common electron transport layer in each of the blue and red pixels so as to decrease a difference of color life spans of the green pixel and each of the blue and red pixels that would have been if there were no auxiliary electron transport layer in the green pixel.

Hereinafter, a fifth embodiment of the present invention will be provided with reference to FIG. 5. Referring to FIG. 5, an organic light emitting display device includes a common electron transport layer 500 and an auxiliary electron transport layer 503 on a red emission layer 430. In this case, the auxiliary electron transport layer 503 is disposed on the red emission layer 430 so as to prevent a color lifespan of the red pixel from decreasing due to the common electron transport layer 500 contributing to the luminance lifespan extension. The structure allows the organic light emitting display device to have improved lifespans of both luminance and color.

In the illustrated embodiment, a ratio by weight of Alq3 to Liq in the common electron transport layer 500 is substantially different from that of Alq3 to Liq in the auxiliary electron transport layer 503. As the results, a ratio by weight of Alq3 to Liq in the combination of the common electron transport layer 500 and the auxiliary electron transport layer 503 of the red pixel is substantially different from that of Alq3 to Liq in the common electron transport layer 500 in each of the blue and green pixels so as to decrease a difference of color life spans of the red pixel and each of the blue and green pixels that would have been if there were no auxiliary electron transport layer in the red pixel.

Hereinafter, a sixth embodiment of the present invention will be provided with reference to FIG. 6. An organic light emitting display device of FIG. 6 includes a common electron transport layer 500 and auxiliary electron transport layers 501 and 502 respectively on blue and green emission layers 410 and 420. In this case, the common electron transport layer 500 may improve all luminance lifespans of OLEDs, and the auxiliary electron transport layers 501 and 502 are disposed on the blue and green emission layers 410 and 420 so as to prevent color lifespans of the blue and green pixels from decreasing.

By the above structure, two deposition processes are performed using masks so that the electron transport layer may have different compositions in the blue, green, and red OLEDs.

In this case, the electron transport layers of each OLED may also have different thicknesses. Herein, the common electron transport layer 500 may have a Alq3 to Liq ratio by weight of about 4:6 to about 7:3, and may have a thickness of about 200 Å to about 450 Å. The auxiliary electron transport layer 501 of the blue pixel may have a Alq3 to Liq ratio by weight of about 2:8 to about 5:5, and may have a thickness of about 50 Å to about 100 Å. Further, the auxiliary electron transport layer 502 of the green pixel may have a Alq3 to Liq ratio by weight of about 3:7 to about 6:4, and may have a thickness of about 50 Å to about 100 Å.

In the illustrated embodiment, a ratio by weight of Alq3 to Liq in the auxiliary electron transport layer 501 is substantially different from that of Alq3 to Liq in the auxiliary electron transport layer 502. As the results, a ratio by weight of Alq3 to Liq in the combination of the common electron transport layer 500 and the auxiliary electron transport layer 503 of the blue pixel is substantially different from that of Alq3 to Liq in the combination of the common electron transport layer 500 and the auxiliary electron transport layer 502 of the green pixel so as to decrease a difference of color life spans of the blue pixel and the green pixel that would have been if there were the ratio of the auxiliary electron transport layer 501 is substantially same as that of the auxiliary electron transport layer 502.

FIG. 7 is a graph showing test results of a color lifespan of the blue pixel of the organic light emitting display device according to the third embodiment of the present invention.

In FIG. 7, the graph curve marked with a dashed line represents changes of color coordinates of the blue pixel according to time in the organic light emitting display device including only the common electron transport layer 500. Further, in FIG. 7, the graph curve marked with an unbroken line represents changes of color coordinates of the blue pixel according to time in the organic light emitting display device including the common electron transport layer 500 and the blue electron transport layer 501. Herein, the common electron transport layer 500 has an Alq3 to Liq ratio by weight of about 5:5, and has a thickness of about 330 Å, and the blue electron transport layer 501 has an Alq3 to Liq ratio by weight of about 4:6, and has a thickness of about 50 Å.

In the above graph, the time for which $\Delta u'v'$ values representing the color coordinate changes are maintained to be 0.04 or less becomes an effective lifespan. It can be understood that if the blue electron transport layer 501 is not provided, the color lifespan of the blue pixel is 55 hours, but if the blue electron transport layer 501 is provided, the color lifespan is extended to 135 hours.

Figure 8:
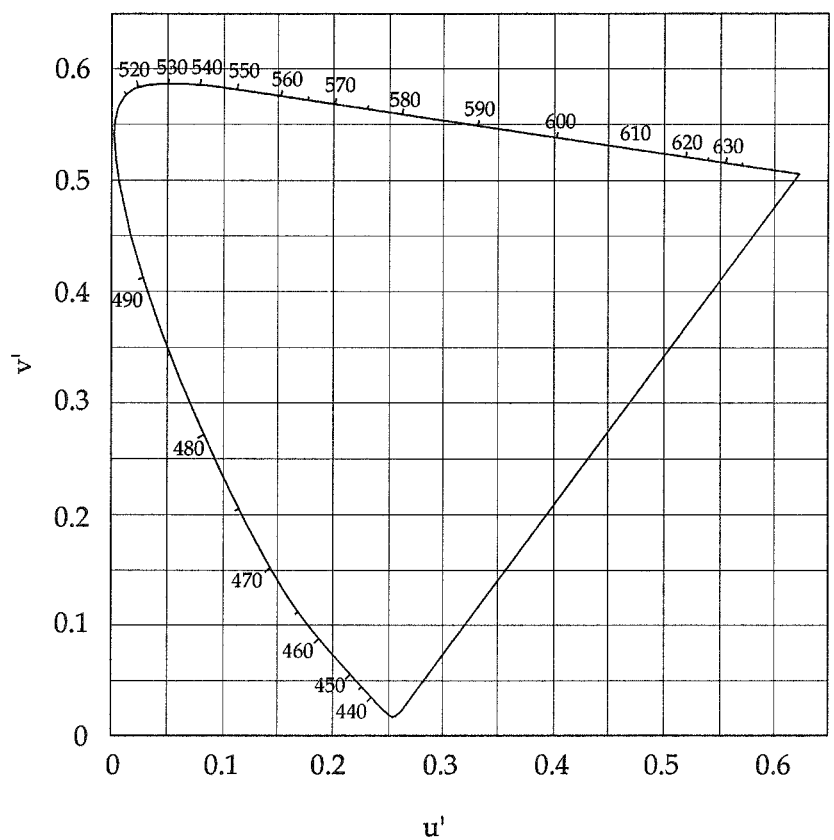
FIG. 8 is a CIE 1976 color space.

Herein, the color coordinates conform to from CIELUV 1976 uniform color space diagram shown in FIG. 8.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims, and equivalents thereof.

What is claimed is:

1. An organic light emitting display device comprising:
   a substrate;
   a first pixel disposed over the substrate and configured emit light having a first color; and
   a second pixel disposed over the substrate and configured to emit light having a second color different from the first color;
   wherein each of the first and second pixels comprises a first electrode disposed over the substrate, a light emission layer formed over the first electrode, an electron transport layer formed over the light emission layer, and a second electrode disposed over the electron transport layer, and
   wherein each electron transport layer of the first and second pixels comprises a first electron transport material and a second electron transport material different from the first electron transport material,
   wherein a ratio by weight of the first electron transport material to the second electron transport material in the electron transport layer of the first pixel is substantially different from that of the first electron transport material to the second electron transport material in the electron transport layer of the second pixel,
   wherein the first electron transport material is Alq3 and the second electron transport material is Liq.

2. The organic light emitting display device of claim 1, further comprising a third pixel disposed over the substrate and configured to emit light having a third color different from the first and second colors, wherein the first, second and third colors are blue, green, and red, respectively.

3. The organic light emitting display device of claim 2, wherein a ratio by weight of Alq3 to Liq in the first pixel is about 2:8 to about 5:5.

4. The organic light emitting display device of claim 2, wherein a ratio by weight of Alq3 to Liq in the second pixel is about 3:7 to about 6:4.

5. The organic light emitting display device of claim 2, wherein a ratio by weight of Alq3 to Liq in the third pixel is about 4:6 to about 7:3.

6. An organic light emitting display device comprising:
   a substrate;
   a first pixel disposed over the substrate and configured emit light having a first color; and
   a second pixel disposed over the substrate and configured to emit light having a second color different from the first color; and
   a third pixel disposed over the substrate and configured to emit light having a third color different from the first and second colors;
   wherein each of the first, second and third pixels comprises first and second electrodes formed over the substrate and a light emission layer disposed between the first and second electrodes,
   wherein the first, second and third pixels comprise a common electron transport layer extending in each of the first, second and third pixels such that the common electron transport layer is disposed between the light emission layer and the second electrode of each of the first, second and third pixels,
   wherein the first pixel comprises an auxiliary electron transport layer that is disposed between the light emission layer and the second electrode of the first pixel,
   wherein each of the common electron transport layer and the auxiliary electron transport layer comprises a first electron transport material and a second electron transport material different from the first electron transport material,
   wherein a ratio by weight of the first electron transport material to the second electron transport material in the common electron transport layer within the first pixel is substantially different from that of the first electron transport material to the second electron transport material in the auxiliary electron transport layer of the first pixel.

7. The organic light emitting display device of claim 6, wherein the common electron transport layer comprises the first electron transport material of Alq3 and the second electron transport material of Liq, and a ratio by weight of Alq3 to Liq is about 4:6 to about 7:3.

8. The organic light emitting display device of claim 7, wherein the first second and third colors are blue, green, and red, respectively, wherein the auxiliary electron transport layer of the first pixel comprises the first electron transport material of Alq3 and the second electron transport material of Liq, and a ratio by weight of Alq3 to Liq is about 2:8 to about 5:5.

9. The organic light emitting display device of claim 7, wherein the first second and third colors are green, blue, and red, respectively, wherein the auxiliary electron transport layer of the first pixel comprises the first electron transport material of Alq3 and the second electron transport material of Liq, and a ratio by weight of Alq3 to Liq is about 3:7 to about 6:4.

10. The organic light emitting display device of claim 6, wherein the common electron transport layer has a thickness of about 200 Å to about 450 Å.

11. The organic light emitting display device of claim 6, wherein the auxiliary electron transport layer comprises the first electron transport material of Alq3 and the second electron transport material of Liq.

12. The organic light emitting display device of claim 6, wherein the first, second and third colors are blue, green, and red, respectively.

13. The organic light emitting display device of claim 6, wherein the common electron transport layer has a thickness of about 50 Å to about 100 Å.

14. The organic light emitting display device of claim 6, wherein the common electron transport layer contacts the auxiliary electron transport layer.

15. The organic light emitting display device of claim 6, wherein the second pixel comprises another auxiliary electron transport layer, wherein the other auxiliary electron transport layer comprises the first electron transport material and the second electron transport material different from the first electron transport material, wherein a ratio by weight of the first electron transport material to the second electron transport material in the other auxiliary electron transport layer is substantially different from that of the first electron transport material to the second electron transport material in each of the common electron transport layer and auxiliary electron transport layer.

16. The organic light emitting display device of claim 6, wherein the electron transport layer of the first pixel comprises first and second sub-layers, wherein a ratio by weight of the first electron transport material to the second electron transport material in the first sub-layer is substantially different from that of the first electron transport material to the second electron transport material in the second sub-layer.

17. The organic light emitting display device of claim 16, wherein the electron transport layer of the second pixel and the first sub-layer of the first pixel are integrated in a single common layer such that the ratio by weight of the first electron transport material to the second electron transport material in the first sub-layer of the first pixel is substantially the same as that of the first electron transport material to the second electron transport material in the electron transport layer of the second pixel.

\* \* \* \* \*